United States Patent [19]

Brown

[11] Patent Number: 4,791,527
[45] Date of Patent: Dec. 13, 1988

[54] PORTABLE RADIO TRANSCEIVER HOUSING STRUCTURALLY SUPPORTED BY BATTERY

[75] Inventor: Vernon L. Brown, Barrington, Ill.

[73] Assignee: Motorola, Inc., Schaumburg, Ill.

[21] Appl. No.: 99,631

[22] Filed: Sep. 22, 1987

Related U.S. Application Data

[63] Continuation of Ser. No. 876,022, Jan. 3, 1985, abandoned.

[51] Int. Cl.$^4$ .............................................. H05K 9/00
[52] U.S. Cl. .................................... 361/424; 361/386; 361/395; 361/399; 455/351
[58] Field of Search ........ 307/150; 361/380, 386-389, 361/393, 394, 395, 399, 424; 429/96-98, 100; 455/346-349, 90, 128, 351

[56] References Cited

U.S. PATENT DOCUMENTS

| | | | |
|---|---|---|---|
| 2,236,384 | 3/1941 | Samuels | 362/194 |
| 2,619,589 | 11/1952 | Florac | 455/351 |
| 2,692,944 | 10/1954 | Mendelson | 455/351 |
| 3,345,568 | 10/1967 | Errichiello et al. | 455/347 |
| 3,522,426 | 8/1970 | Franc | 362/189 |
| 4,025,702 | 5/1977 | Nishimura et al. | 429/142 |
| 4,083,011 | 4/1978 | Ferrell et al. | 455/351 |
| 4,191,917 | 3/1980 | Brown et al. | 307/150 |
| 4,368,507 | 1/1983 | Reynolds | 362/200 |
| 4,409,644 | 10/1983 | Axton et al. | 360/200 |

OTHER PUBLICATIONS

"Circuit Board Technology", by John F. Dennis—Browne, Printed Circuit Fabrication, vol. 8, No. 7, Jul. 1985.

*Primary Examiner*—A. D. Pellinen
*Assistant Examiner*—G. P. Thompson
*Attorney, Agent, or Firm*—Rolland R. Hackbart

[57] ABSTRACT

A unique housing (104 and 600) of a portable radio transceiver (100) is described that takes advantage of the heat sinking, electrical shielding and structural characteristics of a battery. The unique electronic circuitry housing (104 and 600) includes a battery as a structural element thereof. In one illustrated housing (104), a stick battery (210) is attached to the side of a transmitter printed circuit panel (213). A logic printed circuit panel (212) and a receiver printed circuit panel (214) are positioned above and below the transmitter printed circuit panel (213), respectively, and are held together by interlocking side rails (206,207). In a second illustrated housing (600), a flat battery (602) is attached to the sides of a first U-shaped printed circuit panel (604). A second U-shaped printed circuit panel (606) is positioned between the battery and the first panel (604). Heat dissipated by the electrical components on the second panel (606) is conducted away by the flat battery (602). The electronic circuitry housing of the present invention may be advantageously utilized in a variety of applications where electronic circuitry is operated from a battery.

9 Claims, 6 Drawing Sheets 4,791,527

PORTABLE RADIO TRANSCEIVER HOUSING STRUCTURALLY SUPPORTED BY BATTERY

This is a continuation of application Ser. No. 816,022 filed Jan. 3, 1985, now abandoned.

BACKGROUND ART

The present invention is generally related to radio transceivers and more particularly related to an improved portable radio transceiver housing structurally supported by a battery.

In the prior art, batteries for portable radio transceivers were typically designed to be an appendage to or to be inserted into and removed from a receptacle in the portable transceiver housing. For example, the battery was often an appendage to a side of the portable radio transceiver housing (see U.S. Pat. No. Des. 269,873). However, none of the prior art portable radio transceivers took advantage of the heat sinking, electrical shielding and structural characteristics of batteries.

OBJECTS AND SUMMARY OF THE INVENTION

Accordingly, it an object of the present invention to provide an improved electronic circuitry housing that takes advantage of the heat sinking, electrical shielding and structural characteristics of a battery.

It is another object of the present invention to provide an improved electronic circuitry housing including a battery that is a structural element thereof.

It is another object of the present invention to provide an improved, light-weight electronic circuitry housing including a battery that strengthens the housing, shields electrical components therein and sinks heat from electrical components therein.

It is yet another object of the present invention to provide an improved electronic circuitry housing including a battery that is a structural element thereof, whereby the housing is stronger with the battery than without the battery.

Briefly, described, the present invention encompasses an improved electronic circuitry housing including a battery that is a structural element thereof. The housing includes a battery having first and second edges and first and second opposing flat, rigid surfaces, a U-shaped panel having first and second side portions and a center portion, and means for attaching the edges of the battery to the side portions of the panel whereby the battery and the panel substantially enclose and support the electronic circuitry, which is disposed on the inner surface of the center portion of the panel.

DETAILED DESCRIPTION OF THE PREFERRED EMBODIMENT

Figure 1:
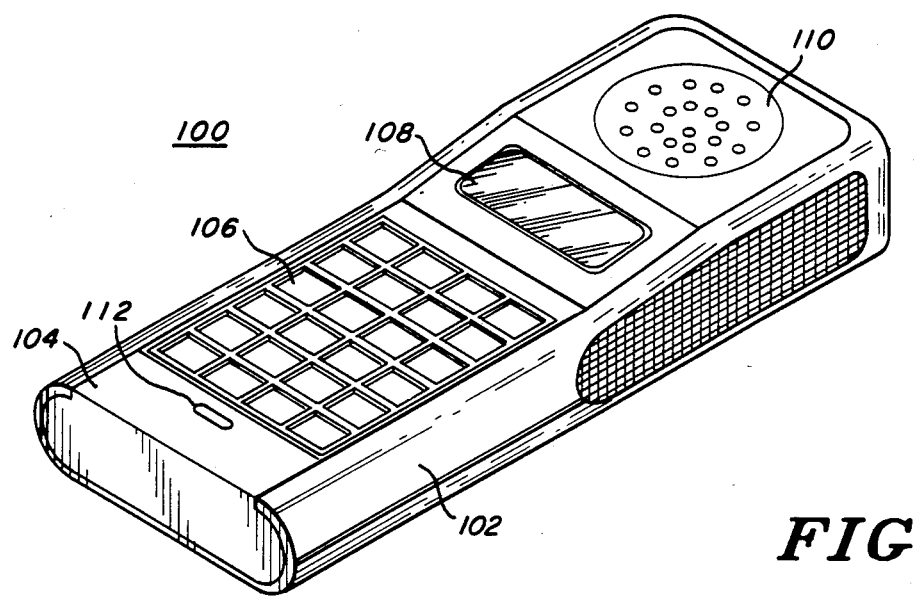
FIG. 1 is a perspective view of a portable radio transceiver embodying the present invention.

In FIG. 1, there is illustrated a perspective view of a portable radio transceiver 100 embodying the present invention. Transceiver 100 includes an outer covering 102 preferably of compliant plastic and an inner shell or housing 104 preferably comprised of sheet metal. Transceiver 100 also includes keyboard 106, display 108, speaker 110 and microphone port 112 for communicating in a radio system. Transceiver 100 may be advantageously utilized in a variety of radio systems, such as, for example, cellular radiotelephone systems and trunked radio systems.

Figure 2:
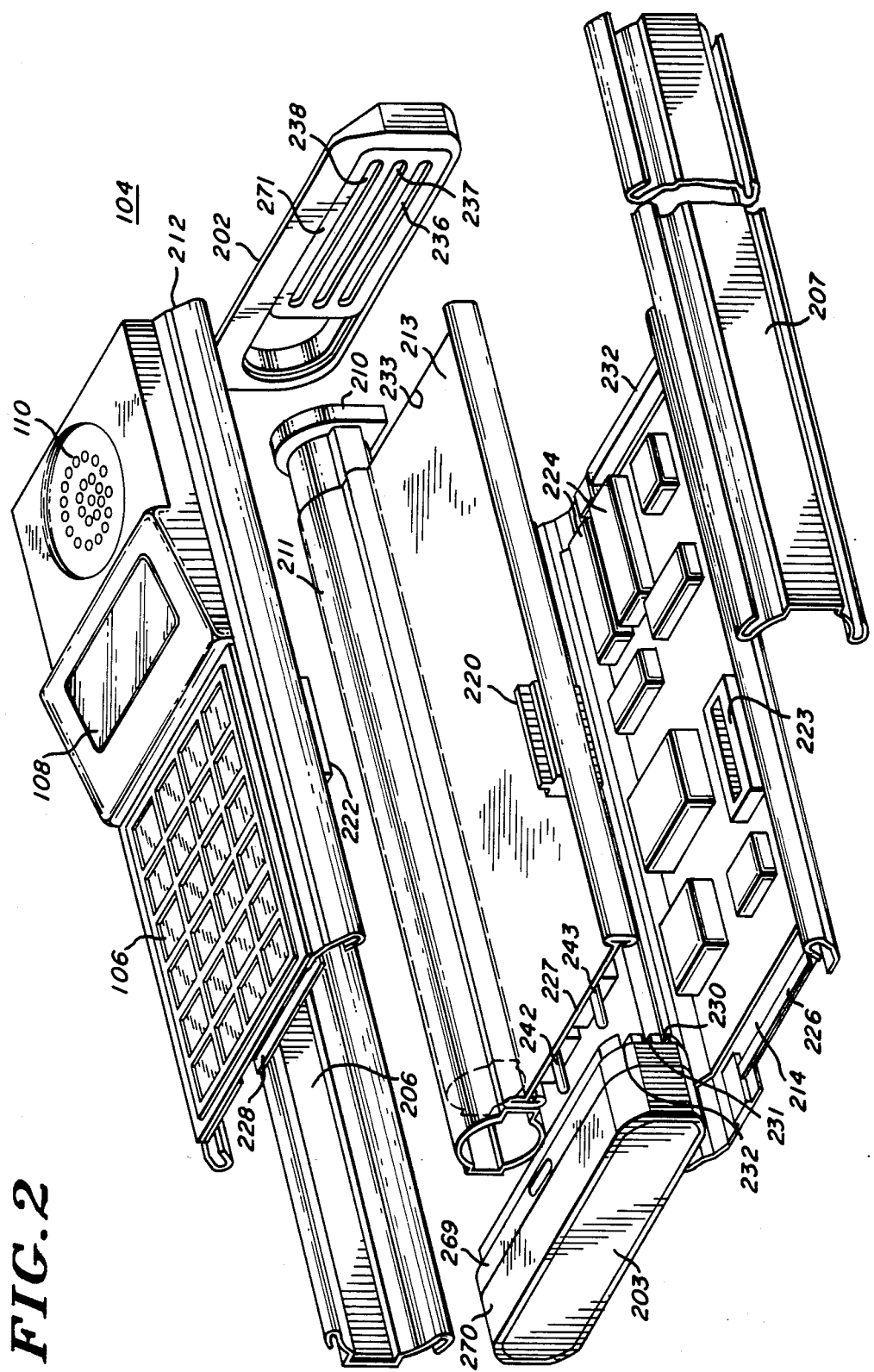
FIG. 2 is an exploded perspective view of the housing of the portable radio transceiver in FIG. 1.

Referring next to FIG. 2, there is illustrated an exploded perspective view of the housing 104 in the portable radio transceiver 100 in FIG. 1. A stick battery 210 inserts into housing 104 and is a structural element thereof. The elements of housing 104 may be made of light-weight sheet metal since battery 210 contributes significantly to the structural strength of the housing. In the preferred embodiment of the present invention, battery 210 includes three to five individual cells which are stacked together as a stick.

Housing 104 in FIG. 2 includes three printed circuit panels 212, 213 and 214, a stick battery 210, a battery tube 211, side rails 206 and 207 and end caps 202 and 203. In the preferred embodiment illustrated in FIG. 2, panels 212, 213 and 214, side rails 206 and 207 and battery tube 211 are made of sheet matal, and the exterior portions of end caps 202 and 203 are made of plastic and metal. Panel 212 is the logic printed circuit panel and includes on one side keyboard 106 and display 108, and on the other side electronic circuitry, which performs the signalling and control functions of the portable transceiver 100. The electronic circuitry on each of the panels 212, 213 and 214 includes surface-mountable electrical components 224 soldered to an electrical circuitry layer, which together with a dielectric layer is laminated to panel 212 (shown in more detail in FIG. 4).

Panel 213 in FIG. 2 is the transmitter printed circuit panel and includes male connector 220 which interconnects panels 212, 213 and 214, and on one side electronic circuitry, which is the radio frequency (RF) transmitter of the portable transceiver 100. Male connector 220 extends on both sides of panel 213 for coupling control, RF and audio signals by way of corresponding female connectors 222 and 223 between the transmitter circuitry, logic circuitry and receiver circuitry (shown in more detail in FIGS. 8 and 9). Panel 213 also includes two connecting pins 242 and 243 that couple transmitter and receiver RF signals to serpentine antenna that is located in end cap 203 (shown in more detail in FIG. 3). Panel 213 has an I-beam cross-section for imparting strength to housing 104. One side of panel 213 inserts into a channel in battery tube 211 for structurally coupling panel 213 to battery 210. In the preferred embodiment illustrated in FIG. 2, battery 210 and tube 211 have canted sides 240 and 241 for resisting torsionally applied forces. These features of battery 210, tube 211 and panel 213 are illustrated in more detail in the cross-sectional view in FIG. 3.

Panel 214 in FIG. 2 is the receiver printed circuit panel and includes on one side electronic circuitry, which is the RF receiver of the portable transceiver 100. Panel 214 includes flanges 226 and 232 which insert into slots 230 and 236 in end caps 203 and 202, respectively, for positioning and retaining panel 214 in housing 104. Similarly, edges 227 and 233 of panel 213 insert into slots 231 and 237 in end caps 203 and 202, respectively for positioning and retaining panel 213 in housing 104; and another flange (similar to flange 228 but not shown) which insert into slots 232 and 238 in end caps 203 and 202, respectively, for positioning and retaining panel 212 in housing 104. Once panels 212, 213 and 214 in FIG. 2 are positioned in end caps 202 and 203, side rails 206 and 207 may be slipped onto the edges of panels 212, 213 and 214 for completing assembly of housing 104. The elements of housing 104 are essentially held together by interlocking geometry which causes side rails 206 and 207 and panels 212, 213 and 214 to be one structure. End cap 202 includes a battery retaining tab (not shown) and metal plate 271 which has slots 236, 237 and 238. Metal plate 271 is connected to end cap 202 by screws (not shown) or adhesive. End cap 203 (shown in more detail in FIG. 5) has an outer portion 270 which is connected to inner portion 269 by screws (not shown) or adhesive. Once assembled, housing 104 is slipped into outer covering 102. Thus, transceiver 100 may be quickly and easily assembled without using screws.

Figure 3:
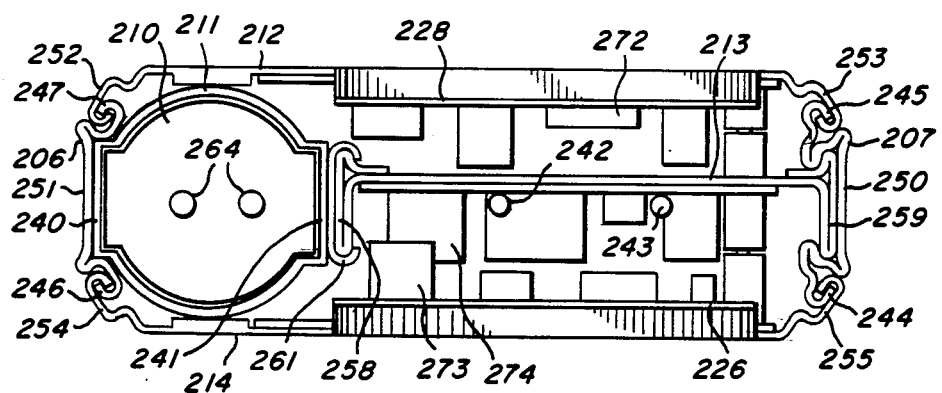
FIG. 3 is an end view of the portable radio transceiver housing in FIG. 2.

Referring next to FIG. 3, there is illustrated an end view of housing 104 where end cap 203 has been removed. The center portion 250 of side rail 207 is shaped to capture the flanged side 259 of panel 213. The center portion 251 of side rail 206 is shaped to fit over side 240 of battery tube 211. In other embodiments, center portion 251 of side rail 206 may be shaped to capture canted side 240 of battery tube 211. Battery tube 211 includes side rail 261 shaped to capture the flanged side 258 of panel 213. Side rail 261 is attached by spot welding or other suitable means to canted side 241 of battery tube 211. Contacts 264 on battery 210 feed a DC voltage to the electronic circuitry by way of contacts on end cap 203 which in turn are coupled to leaf contacts (not shown) that connect to corresponding pads on the transmitter circuitry on panel 213 when housing 104 is assembled. Pins 242 and 243 couple transmitter and receiver signals to an antenna located in end cap 203 (shown in more detail in FIG. 5). Flanges 226 and 228 insert into slots 230 and 232, respectively, in end cap 203 as explained hereinabove with respect to FIG. 2.

The edges 244–247 of side rails 206 and 207 in FIG. 3 include channels which slide into corresponding channels in the edges 252–255 of panels 212 and 214. The center portion 250 of side rail 207 is also shaped to capture the I-beam 259 of panel 213. According to a feature of the present invention, the edges 244–247 of side rails 206 and 207 are also shaped to exert a spring force on the edges 252–255 of panels 212 and 214 when housing 104 is assembled. Furthermore, panels 212, 213 and 214 are strengthened by battery 210 since battery 210 is a structural element of housing 104. As a result, panels 212, 213 and 214 may be made out of sheet metal.

The electronic circuitry on each of the panels 212, 213 and 214 is also illustrated in greater detail in FIG. 3. The logic circuitry on panel 212 includes components 272 which, in the preferred embodiment, are soldered to an electrical circuitry layer, which together with a dielectric layer is laminated to panel 212 (shown in more detail in FIG. 4). Similarly, the transmitter circuitry on panel 213 includes components 274, and the receiver circuitry on panel 214 includes components 273. The components 272 on panel 212 are electrically shielded from the RF signals on panels 213 and 214 since panels 212, 213 and 214 are preferably made of sheet metal and are coupled to signal ground. Furthermore, large components such as component 273 on panel 214 and component 274 on panel 213 may be offset relative to one another such that they may have a vertical length slightly less than the vertical distance between panels 212 and 214.

Figure 5:
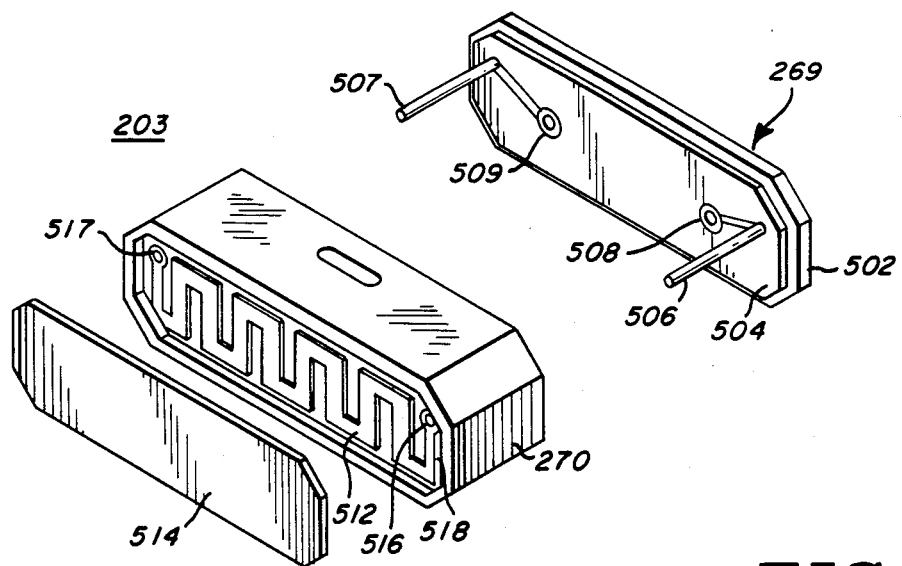
FIG. 5 is an exploded perspective view of the end cap of the portable radio transceiver housing in FIG. 2.

Referring next to FIG. 5, there is illustrated an exploded perspective view of end cap 203 of the portable radio transceiver housing 104 in FIG. 2. End cap 203 includes serpentine antenna therein for transmitting and receiving RF signals. End cap includes inner portion 269, outer portion 270 and cover 514. Inner portion 269 includes metal ground plane 502 and circuit board 504. Circuit board 504 includes posts 506 and 507 which are coupled by stripline circuitry to receptacles 509 and 508, respectively. Outer portion 270 of end cap 203 includes a circuit board 518 having a serpentine loading circuit 512. The serpentine loading circuit 512 is formed by a zig-zag stripline. Pins 242 and 243 on panel 213 in FIG. 2 insert into receptacles 509 and 508, respectively for connecting the transmitter and receiver circuitry to the antenna formed by posts 506 and 507 and serpentine loading circuitry 512. The foregoing antenna circuitry is described in more detail in copending U.S. patent application, Ser. No. 558,270 (now U.S. pat. No. 4,571,595), filed Dec. 5, 1983, entitled "Dual Band Transceiver Antenna" and invented by James P. Phillips and Henry L. Kazecki, which application is incorporated herein in its entirety by reference thereto.

Figure 4:
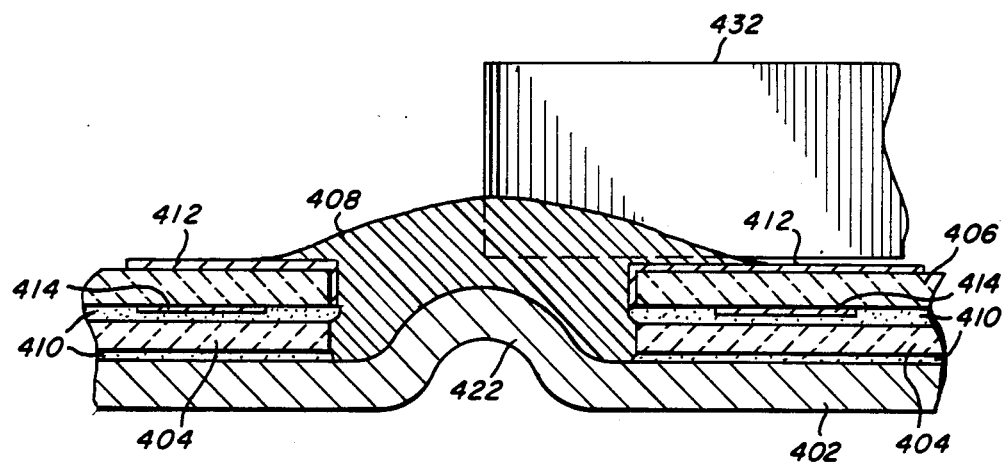
FIG. 4 is a partial cross-sectional view of a printed circuit panel in the portable radio transceiver housing in FIG. 2.

In FIG. 4, there is illustrated a partial cross-sectional view of printed circuit panel 402 representative of printed circuit panels 212, 213 and 214 in the portable radio transceiver housing 104 in FIG. 2. The representative printed circuit panel 402 in FIG. 4 includes an electrical circuitry layer 406 and a dielectric layer 404 which are colaminated to panel 402. Any suitable adhesive 410 may be utilized to laminate or bond dielectric layer 404 to panel 402 and to bond electrical circuitry layer 406 to dielectric layer 404. Electrical circuitry layer 406 includes conductive plating 412 on the top and/or bottom surface thereof for providing pads for mounting electrical components 432 and connectors, and providing circuit paths for electrical signal continuity between such electrical components and connectors. Components 432 are preferable surface mount components similar to those shown and described in my copending U.S. patent application, Ser. No. 759,399, filed July 26, 1983, entitled "Surface Mount Component for Heat Sensitive Electrical Devices", which application is incorporated herein in its entirety by reference thereto.

Panel 402 in FIG. 4 includes a plurality of mesas 422 which are indentations extending up between corresponding holes in the dielectric layer 404 and electrical circuitry layer 406. Mesas 422 protrude through corresponding holes in the dielectric layer 404 and at least partially through corresponding holes in electrical circuitry layer 406. Mesas 422 are preferably bonded by solder 408 to plating 412. In the preferred embodiment, mesas 422 have a height of approximately 0.20 inches and a diameter of 0.040 inches; metal panel 402 has a thickness of 0.015 inches; dielectric layer has a thickness of 0.010 inches; and electrical circuitry layer has a thickness of 0.010 inches. Since panel 402 is preferably made of a conductive metal and coupled to signal ground, mesas 422 couple signal ground to plating 412 on the top surface of layer 406. Furthermore, stripline transmission lines 414 may be produced between grounded plating 412 and grounded metallic panel 404. Stripline transmission lines 414 may be used to provide signal paths in a high frequency circuit, such as those found in RF signal transmitters and receivers. Moreover, in addition to providing signal ground connections, mesas 422 also provide paths for the transfer of dissipated heat from an electrical component 432 on layer 406 to metal panel 402. When mesas 422 are used for heat sinking purposes, the electrical component 432 dissipating the heat may be mounted at least partially on one or more mesas 422, and the mesas 422 may be elongated slots or rectangular indentations or may be indentations shaped to conform to a particular component.

Figure 6:
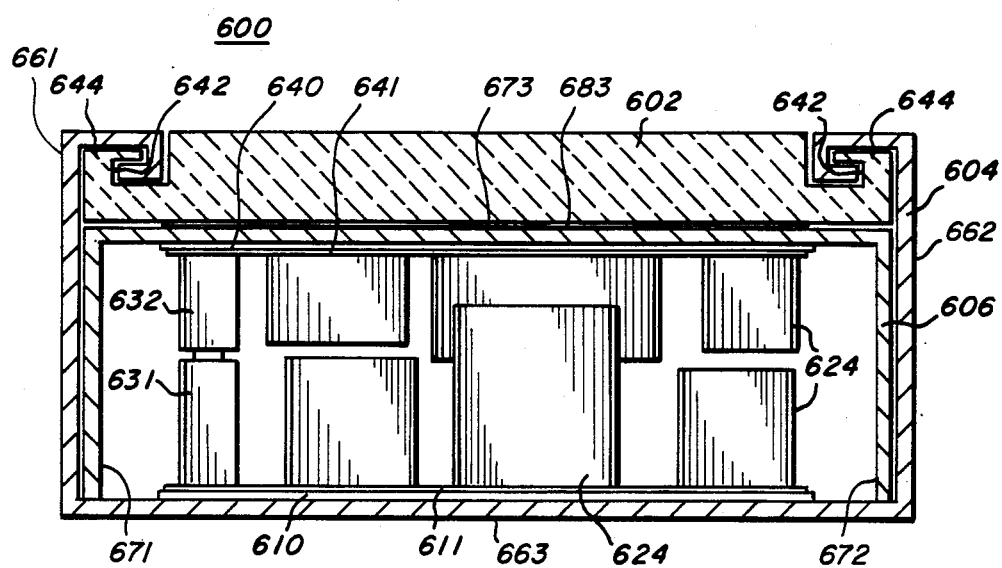
FIG. 6 is a cross-sectional view of another portable radio transceiver housing embodying the present invention.

Referring next to FIG. 6, there is illustrated a cross-sectional view of another portable radio transceiver housing 600 embodying the present invention. As shown in FIG. 6, the ideal battery encompassing the present invention is a flat battery which also becomes a load-bearing surface of the housing 600. The battery walls are not only enclosures for one or more cells but also a structural element of the housing.

Housing 600 in FIG. 6 includes flat battery 602, a first U-shaped panel 604 and a second U-shaped panel 606. U-shaped panel 604 has first and second side portions 661 and 662, respectively, and a center portion 663 having inner and outer surfaces. U-shaped panel 606 has first and second side portions 671 and 672, respectively, and a center portion 673 having inner and outer surfaces. Panels 604 and 606 each include electrical components 624 soldered to a circuitry layers 611 and 641, which is colaminated with dielectric layers 610 and 640 to inner surfaces of the center portions 663 and 673 of panels 604 and 606 respectively by any suitable means. Colaminating circuitry layers 611 and 641 and dielectric layers 610 and 640 to inner surfaces of the center portions 663 and 673 of panels 604 and 606 respectively strengthens panels 604 and 606, thereby enhancing the structural integrity of housing 600. In other embodiments, circuitry layer 611 and dielectric layer 610 may be bonded by adhesives or other suitable means to panels 604 and 606. Connectors 631 and 632 provide for interconnection of electrical signals between panels 604 and 606, respectively. Although housing 600 is shown with two panels 604 and 606, only one panel 606 need be utilized in practicing the present invention.

Battery 602 in FIG. 6 includes edges having channels 644 which mate with corresponding channels 642 in first and second side portions 661 and 662 of panel 604. Channels 642 and 644 extend the entire length of battery 602 and panel 604, respectively. Housing 600 may be assembled by sliding battery 602 into panel 604. Assembly is completed by adding end cap 650, such as caps 202 and 203 in FIG. 2, which end cap 650 may be attached to battery 602 and panel 604 by screws, adhesive or other suitable means.

Figure 7:
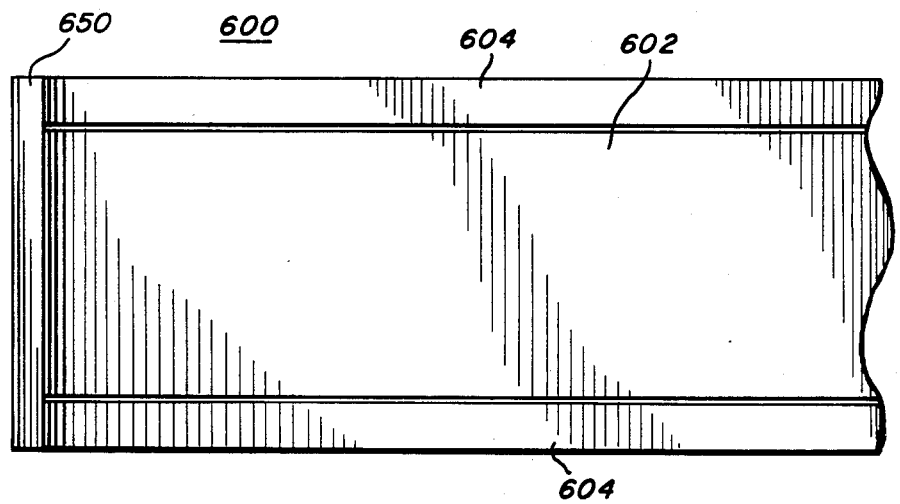
FIG. 7 is a partial top view of the portable radio transceiver in FIG. 6.

As can be seen from the partial top view of housing 600 in FIG. 7, battery 602 is flat and has a length substantially the same as the overall length of housing 600. According to an important feature of the present invention, if battery 602 is at least one-third as long as housing 600, battery 602 will be a structural element of housing 600. In other words, housing 600 is stronger with battery 602 than without it. When battery 602 has a length that is less than one-fourth that of housing 600, battery 602 becomes a load to housing 600 rather than a structural element. However, in such cases, battery 602 may also be a structural element of housing 600 if attached to other elements by keyways, screws, brackets, clamps or other suitable means.

For example, the stick battery 210 in FIG. 2 likewise functions as a structural element of the housing since it picks up a significant portion of applied inertial and static loads. By means of the canted surfaces 240 and 241 of battery 210 in FIG. 3, the torsional strength of the stick battery 210 is used to resist rotational torques applied along the length of housing 104 (X-axis). Similarly, a torque about the Y-axis (width) or a load along the Z-axis (height) is resisted by canted surfaces 240 and 241, side rail 261 and battery tube 211 when sufficient deflection of tube 211 occurs for battery 210 to be loaded as a beam. A load along the Y-axis is resisted by canted surfaces 240 and 241 and by battery 210 when tube 211 is deflected such that it bears on battery 210.

Components 624 in FIG. 6 dissipate varying amounts of heat during operation. Often only one or a few of the components 624 will dissipate a large fraction of the total power dissipated by the electronic apparatus in housing 600 producing a hot spot. Conventional methods minimize the effect of such hot spots by heat sinking such components to a heat spreader and adding to the housing thermal insulation, thereby forcing the internal volume of the housing to rise in temperature and hence equalize the outside surface temperature thereof. However, such conventional methods are undesirable since additional weight and volume is required and higher temperatures are produced which reduce the reliability of the electronic circuitry.

According to the present invention, the thermal mass and heat conduction properties of battery 602 may be utilized to equalize temperatures due to power dissipation within the housing 600 without adding additional mass. Since the lower surface of battery 602 is adjacent to and in contact with panel 606, heat is conducted away from panel 606 by battery 602. Heat transfer can be enhanced by coating the adjoining surfaces of battery 602 and panel 606 with a suitable thermally conductive compound 683. Thus, in housing 600, components 624 dissipating large amounts of heat are preferably mounted on panel 606 such that battery 602 absorbs, spreads and conducts away heat dissipated by such components 624.

A multi-cell battery, such as battery 602 in FIG. 6 or battery 210 in FIG. 2, may be implemented by two methods. In both method, some form of liquid or gas tight cell enclosure is required to electro-chemically separate each cell from the other. First, a very weak or thin outer enclosure only sufficient to maintain the moisture of each cell could be provided around each electrode set thereof. Such cells would be installed into a battery tube or housing which provides the strength needed to contain the contents of the cells and also acts as a structural element of housing 600. Secondly, individual cells may be provided with individually strong enclosures which when coupled together act as a structural element of housing 600.

Figure 8:
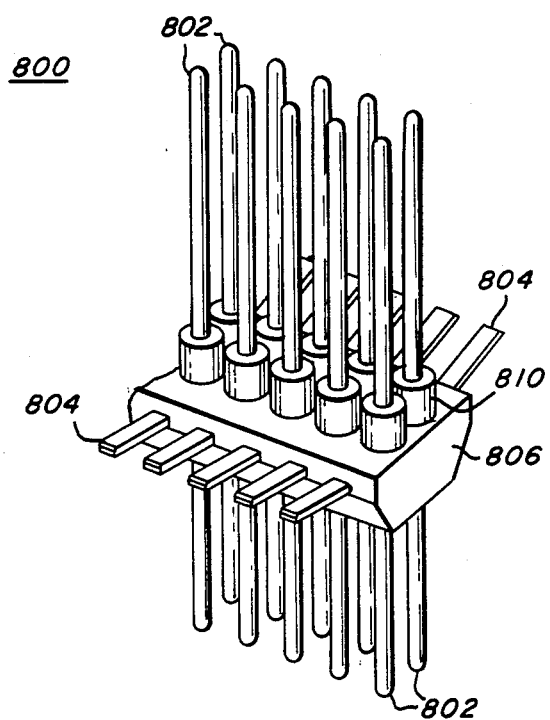
FIG. 8 is a perspective view of a surface-mount connector used to interconnect the three printed circuit panels in the portable radio transceiver housing in FIG. 2.

Turning to FIG. 8, there is illustrated a perspective view of a surface-mount connector 800 used to interconnect two or more printed circuit panels, such as, for example, panels 212, 213 and 214 in the portable radio transceiver housing 104 in FIG. 2. Connector 800 includes a plurality of pins 802 each coupled to a contact 804 and extending through plastic header 806. Plastic header 806 includes portion 810 that insulate corresponding pins 802 from metal panel 213 (shown in more detail in FIG. 9).

Two different methods may be used to manufacture connector 800 in FIG. 8. According to the first method, the contacts 804 are insert molded into the plastic header 806 and pins 802 are press fit in place after molding is completed. The contacts 804 are produced in a "comb" with a slightly extruded hole into which the pins 802 with a cold-formed, bulged center section can be pressed. This method relatively inexpensively provides a generic molded connector 800 that gets its identity after the unique pin 802 is pressed in place. A high temperature plastic is used for header 806, and pins 802 can be produced by a low cost cold heading process. According to a relatively more expensive second method, the pins 802 and contacts 804 are welded or high temperature soldered together and then insert molded into the plastic header 806 using a high temperature solder.

Figure 9:
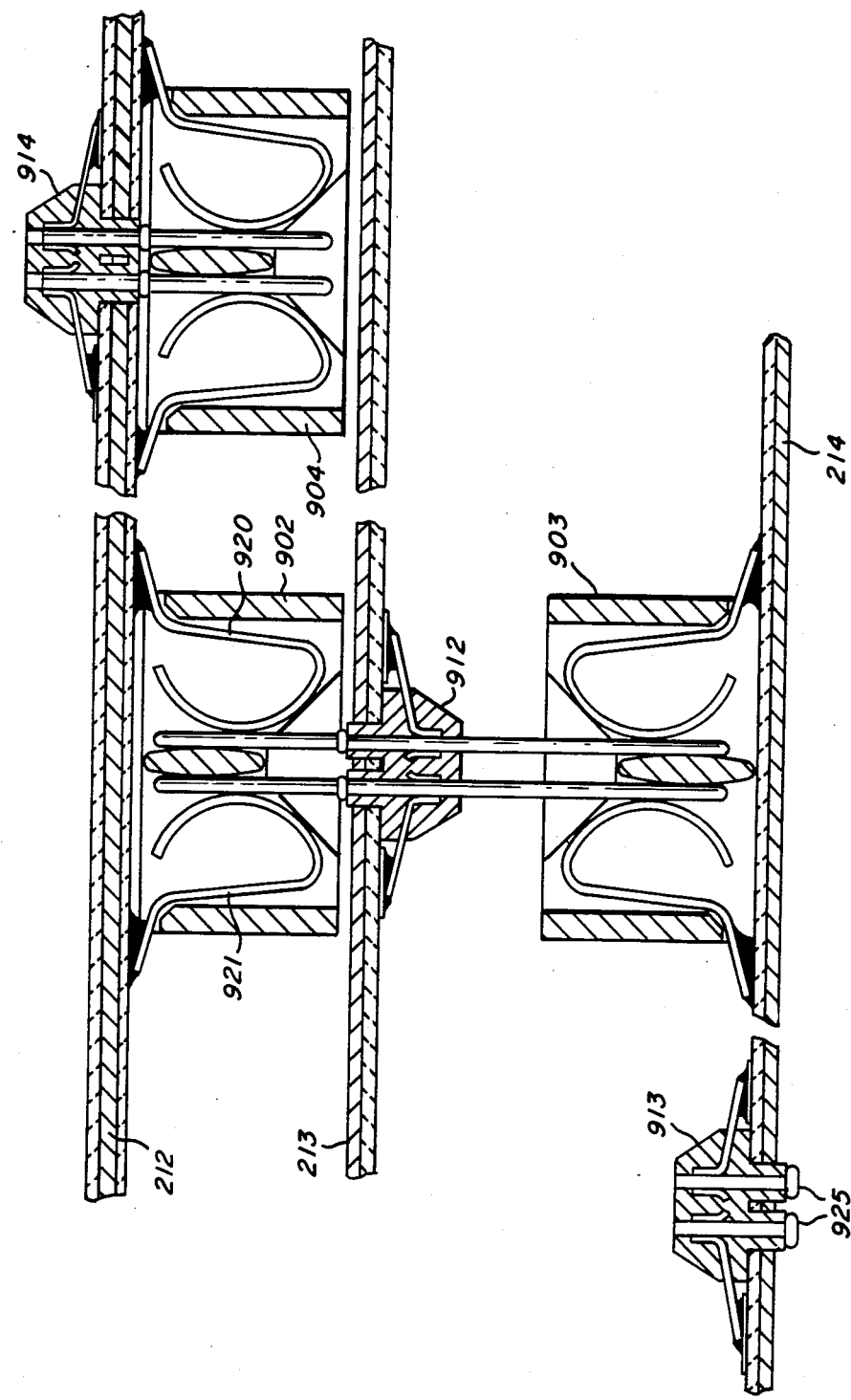
FIG. 9 is a cross-sectional view of the surface-mount connector in FIG. 8 as it may be used to interconnect the three printed circuit panels in the portable radio transceiver housing in FIG. 2.

Referring to FIG. 9, there is illustrated a cross-sectional view of the surface-mount connector in FIG. 8 as it may be used to interconnect the three printed circuit panels in the portable radio transceiver housing in FIG. 2. Three male connectors 912, 913 and 914 and three female connectors 902, 903 and 904 are shown. Connectors 902, 903 and 904 are conventional surface-mount female connectors each including a pair of contacts 920 and 921 for each pair of pins in connector 912. Connector 912 is surface mounted to panel 213 and connected to panel 212 by way of surface-mounted connector 902 and to panel 214 by way of surface-mounted connector 903. Connector 914 is surface mounted to the top side (keyboard, display and speaker side) of panel 212 and connected to the bottom side of panel 212 by way of surface-mounted connector 904. As a result, the circuitry and dielectric layers on the top side of panel 212 may be removed for replacing the keyboard, display and speaker assembly. Connector 913 is surface mounted to panel 214 for providing external contacts 925, which may be used to couple transceiver 100 to an external speakerphone, power amplifier or other peripheral devices.

In summary, a unique portable radio transceiver housing has been described that includes a battery which is a structural element thereof. The battery not only strengthens the housing, but also provides shielding against electromagnetic radiation and sinking of heat dissipated by electrical components. Since the battery is a structural element of the housing, the housing elements can be implemented with sheet metal to produce both a light-weight and structurally strong housing. The portable radio transceiver housing of the present invention may be advantageously utilized in a variety of radio systems including battery-operated radio transceivers, such as, for example, cellular radio-telephone systems and trunked radio systems.

I claim:
1. A housing for electronic circuitry, comprising:
a battery having first and second edges and first and second opposing flat rigid surfaces;
a U-shaped panel having first and second side portions and a center portion, the first and second side portions of said U-shaped panel attaching to the first and second edges of said battery, respectively, said center portion having inner and outer opposing surfaces, said U-shaped panel further including a dielectric and circuitry layer bonded to the inner surface of the center portion of said U-shaped panel;
electronic circuitry bonded to the circuitry layer on the inner surface of said U-shaped panel; and
end cap means coupled to said battery and said U-shaped panel, whereby said end cap means, said battery and said U-shaped panel substantially enclose the electronic circuitry.

2. The housing according to claim 1, wherein said electronic circuitry includes a plurality of surface-mount devices bonded to the circuitry layer.

3. A housing for electronic circuitry, comprising:
a battery having first and second edges and first and second opposing flat rigid metallized surfaces;
a U-shaped panel comprised of metal and having first and second side portions and a center portion, the first and second side portions of said U-shaped panel attaching to the first and second edges of said battery, respectively, said center portion having inner and outer opposing surfaces;
electronic circuitry disposed on the inner surface of said U-shaped panel; and
end cap means coupled to said battery and said U-shaped panel, whereby said end cap means, said battery and said U-shaped panel substantially enclose the electronic circuitry.

4. The housing according to claim 3, wherein said U-shaped panel includes a dielectric and circuitry layer bonded to the inner surface of the center portion of said U-shaped panel, said electronic circuitry being bonded to the circuitry layer.

5. The housing according to claim 4, wherein said electronic circuitry includes a plurality of surface-mount devices bonded to the circuitry layer.

6. A housing for electronic circuitry, comprising:
a battery having first and second edges and first and second opposing flat rigid surfaces;
a first U-shaped panel having first and second side portions and a center portion, the first and second side portions of said first U-shaped panel attaching to the first and second edges of said battery, respectively;
a second U-shaped panel disposed between the sides of said first U-shaped panel and having first and second side portions and a center portion, said center portion of said second U-shaped panel having inner and outer opposing surfaces;
means for thermally coupling the outer surface of said second U-shaped panel to one of the first and second surfaces of said battery;
electronic circuitry disposed on the inner surface of said second U-shaped panel; and
end cap means coupled to said battery and said first U-shaped panel, whereby said end cap means, said battery and said first U-shaped panel substantially enclose the electronic circuitry and said battery conducts away at least a portion of the heat dissipated by the electronic circuitry on said second U-shaped panel.

7. The housing according to claim 6, wherein said first and second U-shaped panels are comprised of metal, whereby said panels electrically shield the electronic circuitry.

8. The housing according to claim 6, wherein said second U-shaped panel includes a dielectric and circuitry layer bonded to the inner surface of the center portion thereof, said electronic circuitry being bonded to the circuitry layer.

9. The housing according to claim 8, wherein said electronic circuitry includes a plurality of surface-mount devices each bonded to the circuitry layer.

* * * * *